United States Patent
Wagner et al.

(10) Patent No.: US 10,985,059 B2
(45) Date of Patent: Apr. 20, 2021

(54) PRECLEAN AND DIELECTRIC DEPOSITION METHODOLOGY FOR SUPERCONDUCTOR INTERCONNECT FABRICATION

(71) Applicants: Brian Paul Wagner, Baltimore, MD (US); Christopher F. Kirby, Gambrills, MD (US); Michael Rennie, Ashland, VA (US); James T. Kelliher, Elkridge, MD (US); Khyhouth Lim, Baltimore, MD (US)

(72) Inventors: Brian Paul Wagner, Baltimore, MD (US); Christopher F. Kirby, Gambrills, MD (US); Michael Rennie, Ashland, VA (US); James T. Kelliher, Elkridge, MD (US); Khyhouth Lim, Baltimore, MD (US)

(73) Assignee: NORTHROP GRUMMAN SYSTEMS CORPORATION, Falls Church, VA (US)

( * ) Notice: Subject to any disclaimer, the term of this patent is extended or adjusted under 35 U.S.C. 154(b) by 0 days.

(21) Appl. No.: 16/178,306

(22) Filed: Nov. 1, 2018

(65) Prior Publication Data
US 2020/0144114 A1    May 7, 2020

(51) Int. Cl.
*H01L 21/768*    (2006.01)
*H01L 21/02*     (2006.01)
(Continued)

(52) U.S. Cl.
CPC .. *H01L 21/76891* (2013.01); *H01L 21/02063* (2013.01); *H01L 21/02068* (2013.01);
(Continued)

(58) Field of Classification Search
None
See application file for complete search history.

(56) References Cited

U.S. PATENT DOCUMENTS 4,904,341 A * 2/1990 Blaugher ............... C03C 15/00
                                                       204/192.24
4,960,751 A    10/1990 Yamazaki
(Continued)

FOREIGN PATENT DOCUMENTS

EP    1076110 A1    2/2001
JP    572680       6/1955
(Continued)

OTHER PUBLICATIONS

Australian Examination Report corresponding to Australian Patent No. 2016365632, pp. 1-4, dated May 3, 2019.
(Continued)

*Primary Examiner* — Andres Munoz
(74) *Attorney, Agent, or Firm* — Tarolli, Sundheim, Covell & Tummino LLP

(57) ABSTRACT

A method is provided of forming a superconductor device interconnect structure. The method comprises forming a first dielectric layer overlying a substrate and forming a superconducting interconnect element in the first dielectric layer. The superconducting interconnect element includes a top surface aligned with a top surface of the first dielectric layer to form a first interconnect layer. The superconductor device interconnect structure is moved into a dielectric deposition chamber. The method further comprises performing a cleaning process on a top surface of the first interconnect layer in the dielectric deposition chamber to remove oxidization from a top surface of the first interconnect layer, and depositing a second dielectric layer over the first interconnect layer in the dielectric deposition chamber.

18 Claims, 7 Drawing Sheets

(51) Int. Cl.
  *H01L 23/532* (2006.01)
  *H01L 39/24* (2006.01)
(52) U.S. Cl.
  CPC .. *H01L 21/76826* (2013.01); *H01L 23/53285* (2013.01); *H01L 23/53295* (2013.01); *H01L 39/2406* (2013.01); *H01L 21/02697* (2013.01)

(56) References Cited

U.S. PATENT DOCUMENTS

| | | | |
|---|---|---|---|
| 5,055,158 | A | 10/1991 | Gallagher et al. |
| 5,600,101 | A | 2/1997 | Sakai |
| 5,807,785 | A * | 9/1998 | Ravi ............... H01L 21/022 438/624 |
| 5,818,071 | A | 10/1998 | Loboda et al. |
| 6,184,477 | B1 | 2/2001 | Tanahashis |
| 6,265,353 | B1 | 7/2001 | Kinder et al. |
| 6,280,201 | B1 | 8/2001 | Morris |
| 6,344,616 | B1 | 2/2002 | Yokokawa |
| 6,365,518 | B1 | 4/2002 | Lee et al. |
| 6,378,757 | B1 | 4/2002 | Holcombe et al. |
| 6,482,656 | B1 | 11/2002 | Lopatin |
| 7,659,197 | B1 | 2/2010 | Juliano |
| 7,776,748 | B2 | 8/2010 | Brcka et al. |
| 8,241,701 | B2 | 8/2012 | Dordi et al. |
| 8,298,936 | B1 | 10/2012 | Rozbicki et al. |
| 9,653,398 | B1 | 5/2017 | Kelliher et al. |
| 10,763,419 | B2 | 9/2020 | Kirby et al. |
| 2003/0203614 | A1 | 10/2003 | Rajagopalan et al. |
| 2004/0005775 | A1 | 1/2004 | Chou et al. |
| 2004/0168636 | A1 | 9/2004 | Savvides et al. |
| 2005/0006222 | A1 | 1/2005 | Ding et al. |
| 2005/0239300 | A1 | 10/2005 | Yasumura et al. |
| 2006/0024951 | A1 | 2/2006 | Schuehrer et al. |
| 2006/0075968 | A1* | 4/2006 | Leung ............... H01J 37/32935 118/723 R |
| 2006/0197193 | A1* | 9/2006 | Gu ............... H01L 23/53285 257/661 |
| 2006/0273446 | A1 | 12/2006 | Sato et al. |
| 2007/0059923 | A1 | 3/2007 | Lee et al. |
| 2007/0184656 | A1 | 8/2007 | Sherman et al. |
| 2007/0193982 | A1 | 8/2007 | Brown et al. |
| 2008/0081482 | A1 | 4/2008 | Brcka et al. |
| 2008/0311711 | A1 | 12/2008 | Hampp et al. |
| 2009/0183984 | A1 | 7/2009 | Sakuma et al. |
| 2011/0147941 | A1 | 6/2011 | Muta |
| 2011/0241765 | A1 | 10/2011 | Pesetski et al. |
| 2014/0027274 | A1 | 1/2014 | Godet et al. |
| 2015/0119252 | A1* | 4/2015 | Ladizinsky ............ B82Y 10/00 505/170 |
| 2015/0179913 | A1* | 6/2015 | Pramanik ............ C23C 14/5806 505/235 |
| 2015/0179914 | A1* | 6/2015 | Greer ............... H01L 23/5329 505/470 |
| 2015/0179918 | A1* | 6/2015 | Greer ............... H01L 39/2493 505/329 |
| 2015/0236235 | A1 | 8/2015 | Ladizinsky et al. |
| 2017/0162513 | A1* | 6/2017 | Kelliher ............... H01L 23/5329 |
| 2018/0053689 | A1* | 2/2018 | Kirby ............... H01L 21/76891 |
| 2018/0151430 | A1 | 5/2018 | Kirby et al. |
| 2018/0351072 | A1* | 12/2018 | Kirby ............... H01L 21/7684 |

FOREIGN PATENT DOCUMENTS

| | | |
|---|---|---|
| JP | S61233691 A | 10/1986 |
| JP | S6281075 A | 4/1987 |
| JP | S63130792 A | 6/1988 |
| JP | 64-064274 A | 12/1988 |
| JP | H025580 A | 1/1990 |
| JP | H02141569 A | 5/1990 |
| JP | H10150228 A | 6/1998 |
| JP | 3190289 B2 | 7/2001 |
| JP | 2002043640 A | 2/2002 |
| JP | 2002299705 A | 10/2002 |
| JP | 2004232054 A | 8/2004 |
| JP | 2008532271 A | 8/2008 |
| JP | 2009111306 A | 5/2009 |
| JP | 2009278125 A | 11/2009 |
| JP | 2011164068 A | 8/2011 |
| JP | 2012519379 A | 8/2012 |
| JP | 2015511067 A | 4/2015 |
| JP | 6334231 B2 | 5/2018 |
| KR | 20000026669 A | 5/2000 |
| KR | 1020010072404 B1 | 7/2001 |
| KR | 1020070120011 A | 10/2007 |
| WO | 2003079429 A1 | 9/2003 |
| WO | 2018075117 A2 | 4/2018 |

OTHER PUBLICATIONS

International Preliminary Report on Patentability corresponding to International Application No. PCT/US2017/050520, pp. 1-10, dated Apr. 4, 2019.
United States Office Action corresponding to U.S. Appl. No. 15/351,755, pp. 1-8, dated Jun. 26, 2019.
International Search Report and Written Opinion corresponding to International Application No. US/PCT2018/033299 dated Mar. 6, 2019.
Canadian Office Action and Search Report corresponding to Canadian Patent Application No. 3033652, pp. 1-5, dated Apr. 15, 2019.
Final Office Action for U.S. Appl. No. 15/612,326 dated Nov. 8, 2019.
Canadian Office Action corresponding to Canadian Patent Application No. 3006284 dated Mar. 21, 2019.
Japanese Office Action for Application No. 2018-527930 dated Jul. 23, 2019.
Australian Examination Report for Application No. 2017345050 dated Jul. 20, 2019.
Australian Examination Report for Application No. 2017345049 dated Aug. 5, 2019.
Australian Examination Report for Application No. 2017358595 dated Aug. 6, 2019.
Ramzi, A, et al., "Niobium and Aluminum Josephson Junctions Fabricated with a Damascene CMP Process", Physics Procedia, vol. 36, pp. 211-216 (2012). DOI: 10.1016/j.phpro.2012-06-148.
International Preliminary Report on Patentability for Application No. PCT/US2018/031139 dated Nov. 28, 2019.
Australian Examination Report for Application No. 2017360504 dated Dec. 20, 2019.
Australian Examination Report for Application No. 2017345049 dated Dec. 19, 2019.
Korean Office Action for Application No. 10-2018-7016289 dated Nov. 12, 2019.
Canadian Office Action for Application No. 3,033,343 dated Jun. 9, 2020.
Japanese Office Action for Application No. 2019/508827 dated May 19, 2020.
Canadian Office Action for Application No. 3,041,827 dated Jun. 16, 2020.
Korean Office Action for Application No. 10-2019-7007376 dated May 15, 2020.
Australian Office Action for Application No. 2018270769 dated May 20, 2020.
Australian Office Action for Application No. 2017366449 dated Jul. 6, 2020.
Tolpygo, et al. "Plasma process-induced damage to Josephons tunnel junctions in superconducting integrated circuits" Superconductor Science and Technology, vol. 20, No. 11, Oct. 18, 2007.
International Search Report for International Application No. PCT/US2019/054551 dated Jan. 21, 2020.
Non Final Office Action for U.S. Appl. No. 15/612,326 dated Mar. 19, 2020.
Japanese Office Action for Patent Application No. 2019-520518 dated Apr. 13, 2020.
Korean Office Action for Application No. 10-2019-708632 dated Mar. 11, 2020.
Japanese Office Action for Application No. 2019-508819 dated Mar. 3, 2020.

(56) References Cited

OTHER PUBLICATIONS

Japanese Office Action for Application No. 2019-521826 dated Mar. 10, 2020.
Korean Office Action for Application No. 10-2019-7007405 dated Mar. 6, 2020.
Korean Notice of Preliminary Rejection for Korean Patent Application No. 10-2019-7014101 dated Apr. 13, 2020.
Japanese Office Action for Application No. 2019-558767 dated Oct. 22, 2020.
Korean Office Action for Application No. 10-2019-7035670 dated Nov. 24, 2020.
Japanese Office Action for Application No. 2019-559098 dated Jan. 5, 2021.
Canadian Office Action for Application No. 3061737 dated Jan. 7, 2021.

* cited by examiner

PRECLEAN AND DIELECTRIC DEPOSITION METHODOLOGY FOR SUPERCONDUCTOR INTERCONNECT FABRICATION

GOVERNMENT INTEREST

The invention was made under US Contract Number 30080984. Therefore, the US Government has rights to the invention as specified in that contract.

TECHNICAL FIELD

The present invention relates generally to superconductors, and more particularly to a preclean and dielectric deposition methodology for superconductor interconnect fabrication.

BACKGROUND

Superconducting circuits are one of the leading technologies proposed for quantum computing and cryptography applications that are expected to provide significant enhancements to national security applications where communication signal integrity or computing power are needed. They are operated at temperatures <100 kelvin. Efforts on fabrication of superconducting devices have mostly been confined to university or government research labs, with little published on the mass producing of superconducting devices. Therefore, many of the methods used to fabricate superconducting devices in these laboratories utilize processes or equipment incapable of rapid, consistent fabrication. Recently there has been a movement to mass producing superconducting circuits utilizing similar techniques as those utilized in conventional semiconductor processes.

One well-known semiconductor process is the formation of contacts and conductive lines in a multi-level interconnect stack to couple devices to one another over different layers of an integrated circuit. One such fabrication process for formation of conductive contacts and lines is known as a dual damascene process. This technique has recently been attempted in the formation of superconducting circuits. During the fabrication of dual damascene superconducting circuits, via/trench structures are patterned, etched, filled with metal (e.g., niobium, tantalum, aluminum), then polished back using a chemical mechanical polishing (CMP) process. The next level dielectric is then deposited, and the sequence begins again, building up a multi-level interconnect stack. The CMP process and any exposure to oxygen prior to deposition of the next dielectric layer can result in oxidization of the conductive contacts and lines, which degrades performance.

SUMMARY

In one example, a method is provided of forming a superconductor device interconnect structure. The method comprises forming a first dielectric layer overlying a substrate and forming a superconducting interconnect element in the first dielectric layer. The superconducting interconnect element includes a top surface aligned with a top surface of the first dielectric layer to form a first interconnect layer. The superconductor device interconnect structure is moved into a dielectric deposition chamber. The method further comprises performing a cleaning process on a top surface of the first interconnect layer in the dielectric deposition chamber to remove oxidization from a top surface of the first interconnect layer, and depositing a second dielectric layer over the first interconnect layer in the dielectric deposition chamber.

In another example, a method is provided of forming a superconductor device interconnect structure. The method comprises disposing a superconducting interconnect layer in a dielectric deposition chamber. The superconducting interconnect layer includes a superconducting contact or conductive line having a top surface aligned with a top surface of a first dielectric layer, wherein a top surface of the superconducting contact or conductive line has an oxidized layer, and the top surface of the first dielectric layer has an oxidized layer. Nitrogen trifluoride ($NF_3$) gas is introduced into the dielectric deposition chamber with etch conditions set to induce a plasma clean etch with the $NF_3$ gas for a predetermined time period to remove the oxidized layer from the superconducting contact or conductive line and the oxidized layer from the first dielectric layer. The $NF_3$ gas is evacuated from the dielectric deposition chamber and a second dielectric layer is deposited over the superconducting interconnect layer.

DETAILED DESCRIPTION

Figure 1:
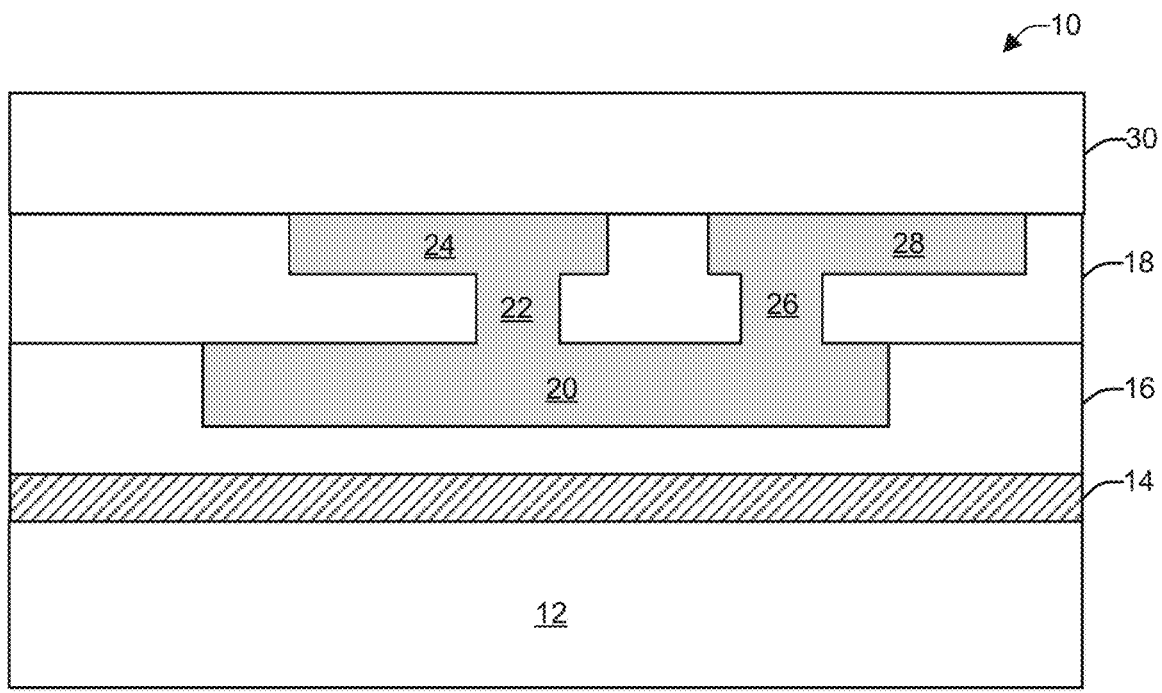
FIG. 1 illustrates cross-sectional view of a superconducting device interconnect structure.

The present invention is directed to a superconductor interconnect structure and a method for forming the same. The method incorporates a preclean process to remove oxide layers from superconducting metal interconnect elements (e.g., conductive lines, contacts) and the interlayer dielectric (ILD) surfaces prior to encapsulation of the metal interconnect elements in the next level of dielectric. The oxides can be as a result of a chemical mechanical process (CMP), and/or as a result of the exposure of the superconductor interconnect structure to oxygen outside of a vacuum environment. In one example, the method integrates a plasma preclean process into a dual damascene process for scaling into a high-density multilevel interconnect submicron technology. The method can employ a nitrogen trifluoride ($NF_3$) gas based in-situ plasma preclean etch process prior to dielectric deposition of a next layer in the dual damascene process to assure a smooth clean surface of the metal interconnect elements and the ILD surface on the underlying layer.

In typical damascene superconducting fabrication architectures, oxide removal by etching of the metal interconnect oxide (typically niobium oxide) and ILD surface oxide utilizes either an etch chamber separate from the deposition chamber on the same mainframe so the transfer is done in vacuo or by utilizing an oxide etch chamber on a different mainframe whereby the wafer is transported between mainframes. In either case, oxides form on the surfaces during the transfer even when transfers occur close to vacuum.

A system and method are disclosed herein is to preclean by etching contaminants from a Silicon (Si), dielectric, or metal surface of a superconductor structure and the deposition of an overlying dielectric layer within a single dielectric deposition chamber. This process is of particular significance with respect to eliminating surface oxides prior to dielectric deposition of superconducting interconnects. The removal of these surface oxides supports the following improvements in a superconducting electronics fabrication process: eliminating oxygen sources from interface which can diffuse into superconducting metallization (e.g., Niobium) during subsequent processing and reduce interconnect critical current (Ic) performance; eliminating unintended oxide layers during the deposition of Josephson Junction metallization which reduce the yield, uniformity, and repeatability of these structures; and the eliminating of high-loss interface oxides between dielectric material and superconducting traces which reduce the effective loss tangent of superconducting circuit elements.

In one example, a system is provided that includes a plasma enhanced chemical vapor deposition (PECVD) platform that is configured to support both an independent preclean process and dielectric deposition process in a single PECVD chamber. The Process of Record (POR) uses two chambers 1) preclean chamber and 2) deposition chamber. This disclosure combines both the preclean and deposition process into a single chamber, which prevent any further oxidation from occurring during the transfer from an external etch chamber to a deposition chamber. The intention of the system and method of the present disclosure is to eliminate unintended oxidation by establishing the capability to etch surface oxides/contaminants and dielectric deposition in a single chamber. This technique eliminates exposing a clean wafer surface to the oxidizing environment prior to dielectric deposition, for example, in transfer/buffer chambers employed in cluster tools.

FIG. 1 illustrates cross-sectional view of a superconducting interconnect structure 10, for example, formed on a portion of a wafer. The superconducting interconnect structure 10 includes an active layer 14 overlying a substrate 12. The substrate 12 can be formed of silicon, glass or other substrate material. The active layer 14 can be a ground layer or a device layer. A first dielectric layer 16 overlies the active layer 14, and a second dielectric layer 18 overlies the first dielectric layer 16. Both the first and the second dielectric layers 16 and 18 can be formed of a non-oxide based dielectric material. A first conductive line 20 is embedded in the first dielectric layer 16. A first conductive contact 22 extends from the first conductive line 20 at a first end to a second conductive line 24 in the second dielectric layer 18, and a second conductive contact 26 extends from the first conductive line 20 at a second end to a third conductive line 28 in the second dielectric layer 18. A third dielectric layer overlies the second conductive line 24, the third conductive line 28 and the second dielectric layer 18. Each dielectric layer can be formed of a non-oxide based dielectric, such as silicon nitride, amorphous silicon, or amorphous SiC.

Each of the contacts and conductive lines are formed of a superconducting material, such as niobium. A cleaning process as described herein is performed prior to deposition of the third dielectric layer with both the cleaning process and the dielectric deposition process being performed in a single dielectric deposition chamber. A cleaning process can also be performed prior to deposition of the second dielectric layer 18 with both the cleaning process and the deposition of the second dielectric layer being performed in the same single dielectric deposition chamber.

Turning now to FIGS. 2-9, fabrication is discussed in connection with formation of interconnects in the superconducting device of FIG. 1. It is to be appreciated that the present example is discussed with respect to a process flow that starts with the formation of either a single or dual damascene layer of superconducting metal in an insulating dielectric. The present example will be illustrated with respect to a single damascene trench etched into a dielectric thin film to form a bottom conductive line followed by a dual damascene process to form top conductive lines.

Figure 2:
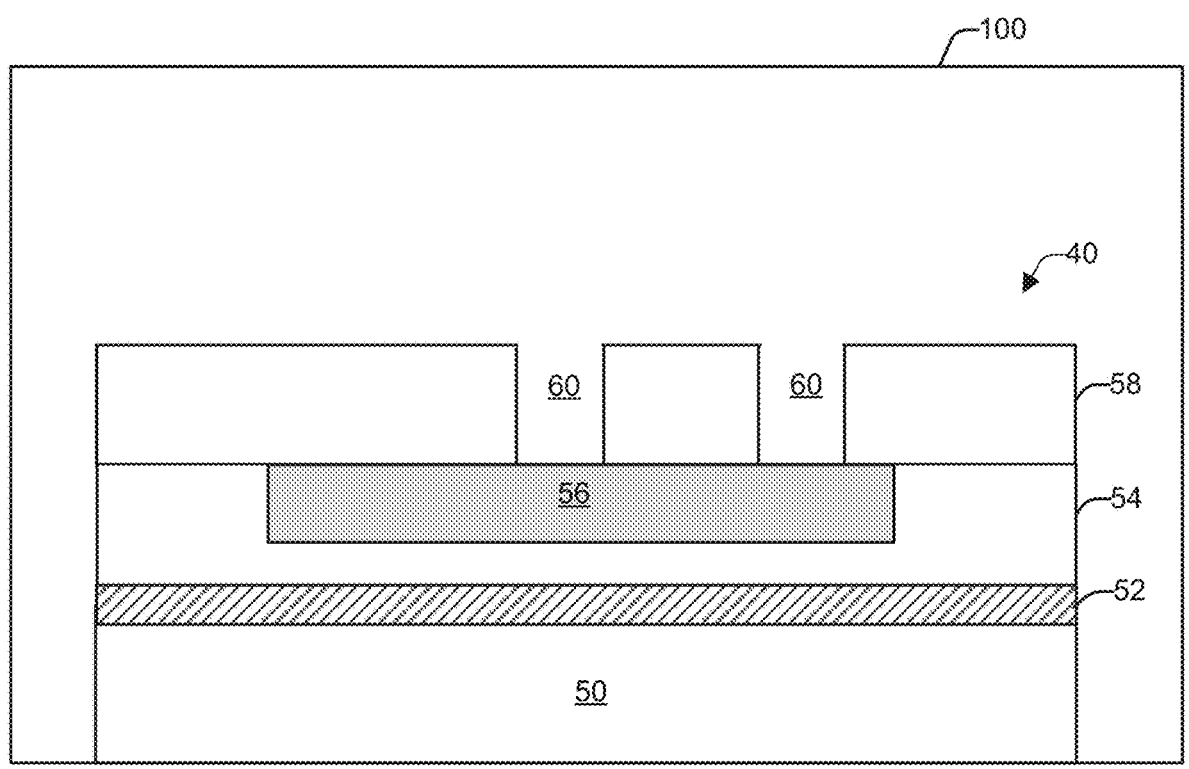
FIG. 2 illustrates a schematic cross-sectional view of an example of a superconductor structure in its early stages of fabrication.

FIG. 2 illustrates a cross-sectional view of a superconductor structure 40 in its early stages of fabrication. The superconductor structure 40 resides in an etch chamber for forming vias and trenches in one or more dielectric layers. The superconductor structure 40 includes an active layer 52, such as a ground layer or device layer, that overlays an underlying substrate 50. The underlying substrate 50 can be, for example, a silicon or glass wafer that provides mechanical support for the active layer 52 and subsequent overlying layers. A first dielectric layer 54 is formed over the active layer 52. Any suitable technique for forming the first dielectric layer 54 may be employed such as Low Pressure Chemical Vapor Deposition (LPCVD), Plasma Enhanced Chemical Vapor Deposition (PECVD), High Density Plasma Chemical Vapor Deposition (HDPCVD), sputtering or spin-on techniques to a thickness suitable for providing an interconnect layer. Alternatively, the first dielectric layer 54 can be formed directly on the substrate 50 in examples in which the active layer 52 is omitted. A conductive line 56 resides within the first dielectric layer 54 and has a top surface that is flush with a top surface of the first dielectric layer 54. The conductive line 56 can be formed in a single damascene process, and goes through a cleaning process prior to deposition of the next dielectric layer.

Figure 3:
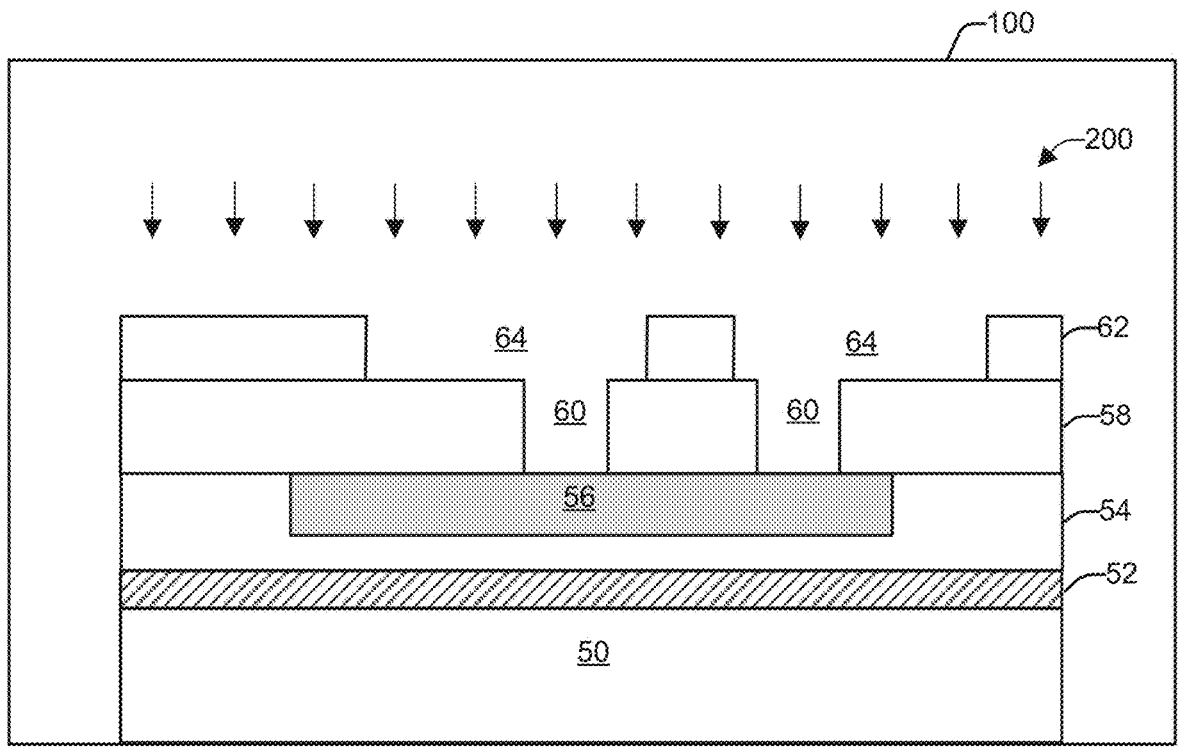
FIG. 3 illustrates a schematic cross-sectional view of the structure of FIG. 2 after a photoresist material layer has been deposited and patterned, and while undergoing an etch process in an etch chamber.
Figure 4:
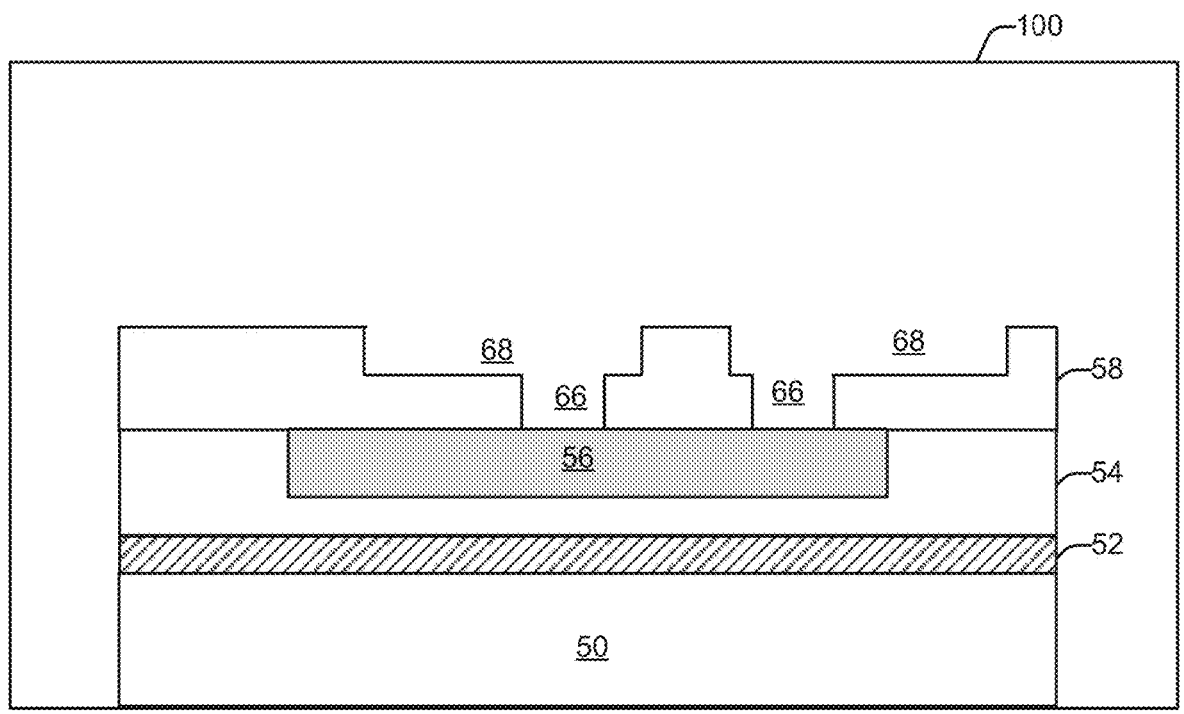
FIG. 4 illustrates a schematic cross-sectional view of the structure of FIG. 3 after the etch process and after the photoresist material layer has been stripped.

The cleaning process is in situ plasma $NF_3$ clean in a deposition chamber prior to the next dielectric layer 58 being deposited to remove any oxide from the surface of the conductive line 56. This process will be explained in further detail with reference to FIGS. 6-9. The second dielectric layer 58 overlies the first dielectric layer 54 and includes a pair of vias 60 that extend from a top surface of the second dielectric layer 58 to a top surface of the conductive line 56 that resides in the first dielectric layer 54. The dielectric material employed in the first dielectric layer 54 and the second dielectric layer 56 can be formed from a non-oxide based dielectric material. The pair of vias 60 were formed in a first portion of a dual damascene process. FIG. 3 illustrates a second portion of the dual damascene process. As illustrated in FIG. 3, a photoresist material layer 62 has been applied to cover the structure and patterned and developed to expose trench openings 64 in the photoresist material layer 62 in accordance with a trench pattern. The photoresist material layer 62 can have a thickness that varies in correspondence with the wavelength of radiation used to pattern the photoresist material layer 62. The photoresist material layer 62 may be formed over the second dielectric layer 58 via spin-coating or spin casting deposition techniques, selectively irradiated (e.g., via deep ultraviolet (DUV) irradiation) and developed to form the trench openings 64.

FIG. 3 also illustrates performing of an etch 200 (e.g., anisotropic reactive ion etching (RIE)) on the second dielectric layer 58 to form extended trench openings 68 (FIG. 4) in the second dielectric layer 58 based on the trench pattern in the photoresist material layer 62. The etch 200 can be a dry etch and employ an etchant which selectively etches the underlying second dielectric layer 58 at a faster rate than the underlying conductive line 56 and the overlying photoresist material layer 62. For example, the second dielectric layer 58 may be anisotropically etched with a plasma gas(es), herein carbon tetrafluoride ($CF_4$) containing fluorine ions, in a commercially available etcher, such as a parallel plate RIE apparatus or, alternatively, an electron cyclotron resonance (ECR) plasma reactor to replicate the mask pattern of the patterned of the photoresist material layer 62 to thereby create the extended trench openings 64. The photoresist material layer 62 is thereafter stripped (e.g., ashing in an $O_2$ plasma) so as to result in the structure shown in FIG. 4.

Figure 5:
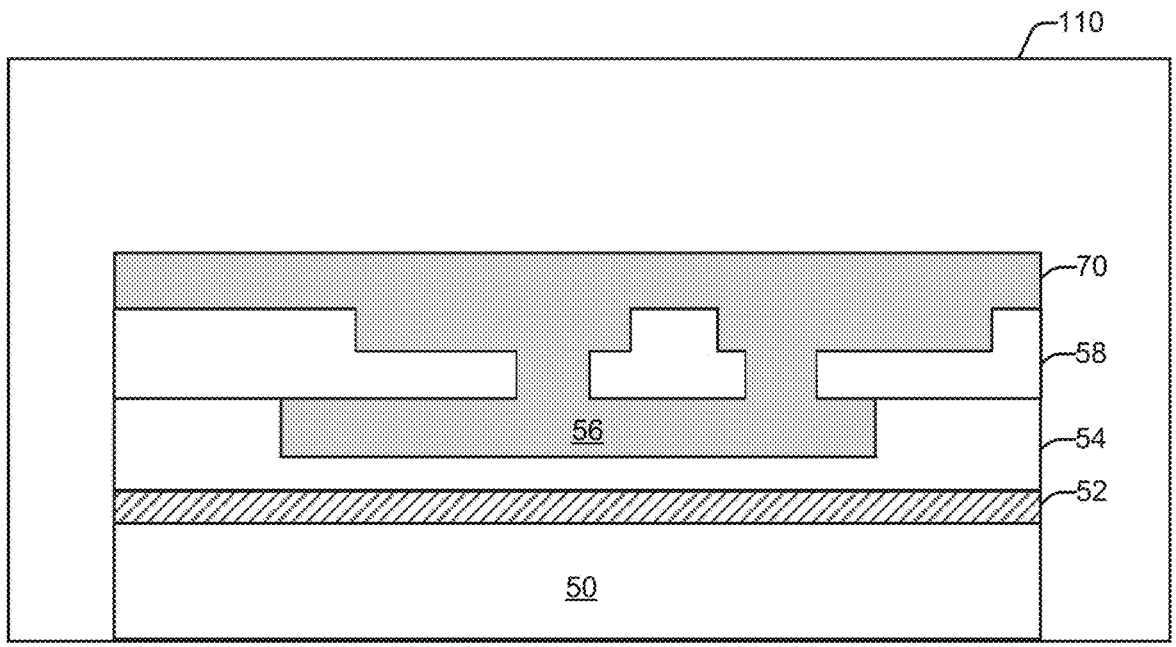
FIG. 5 illustrates a schematic cross-sectional view of the structure of FIG. 4 after a contact material fill in a material deposition chamber.
Figure 6:
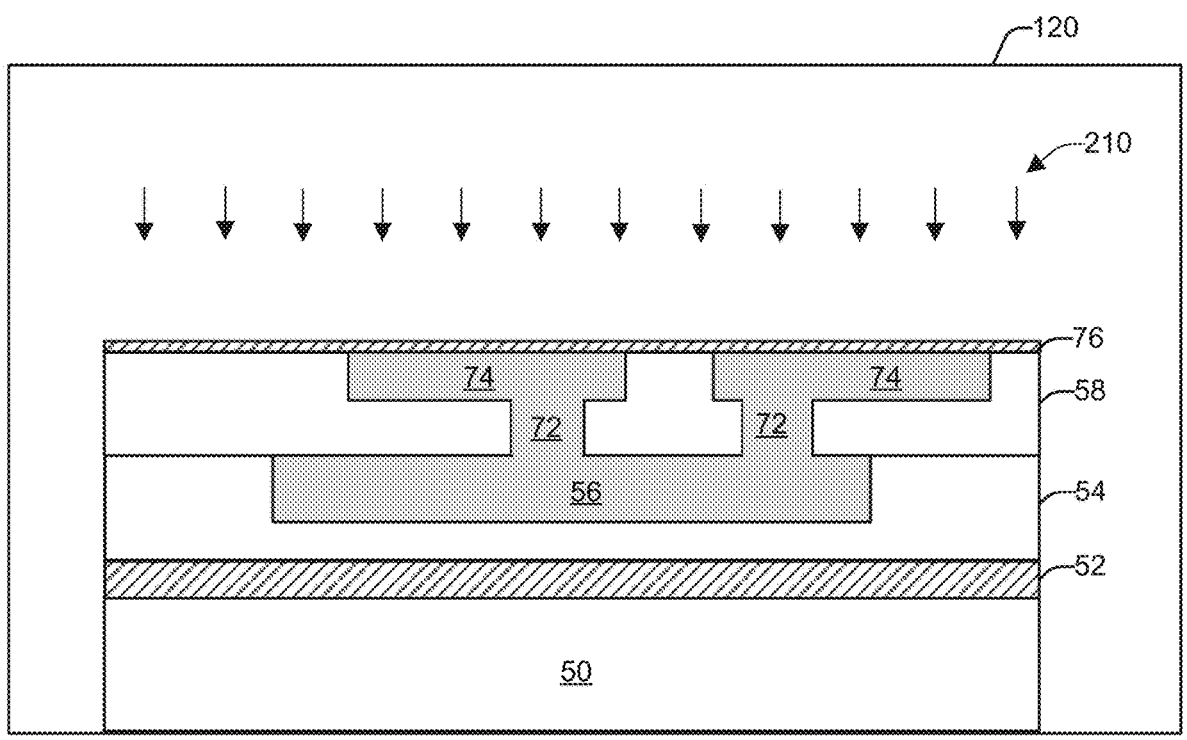
FIG. 6 illustrates a schematic cross-sectional view of the structure of FIG. 5 undergoing a chemical mechanical polish.

Next, as illustrated in FIG. 5, the structure is placed into a material deposition chamber 110 and undergoes a contact material fill to deposit a superconducting material 70, such as niobium, into the via openings 66 and the trench openings 68 to form the resultant structure shown in FIG. 5. The contact material fill can be deposited employing a standard contact material deposition. Following deposition of the contact material fill, the superconducting material 70 is placed into a polish chamber 120 and is polished via chemical mechanical polishing (CMP) down to the surface level of the dielectric layer 58 to form conductive lines 74 and contacts 72 that form part of the metal interconnects and provide the resultant structure of FIG. 6.

However, during the CMP process, an oxide surface 76 may grow on the surface of the metal to a thickness of approximately 70 Å, and remain even after the CMP process is complete. This oxide grows, for example, due to the presence of ammonium hydroxide and hydrogen peroxide in the CMP process. In the case where niobium is employed as the metal, a niobium oxide is formed. The presence of this niobium oxide will degrade the performance of the superconducting circuits (losses in the metal lines), so it needs be removed prior to the deposition of the next dielectric layer. A silicon oxide is formed on the deposited dielectric surface (e.g., on silicon nitride). The presence of this niobium oxide and silicon oxide will degrade the performance of the superconducting circuits through a variety of RF loss mechanisms typically associated with amorphous oxides so it needs to be removed prior to the deposition of the next dielectric layer.

Figure 7:
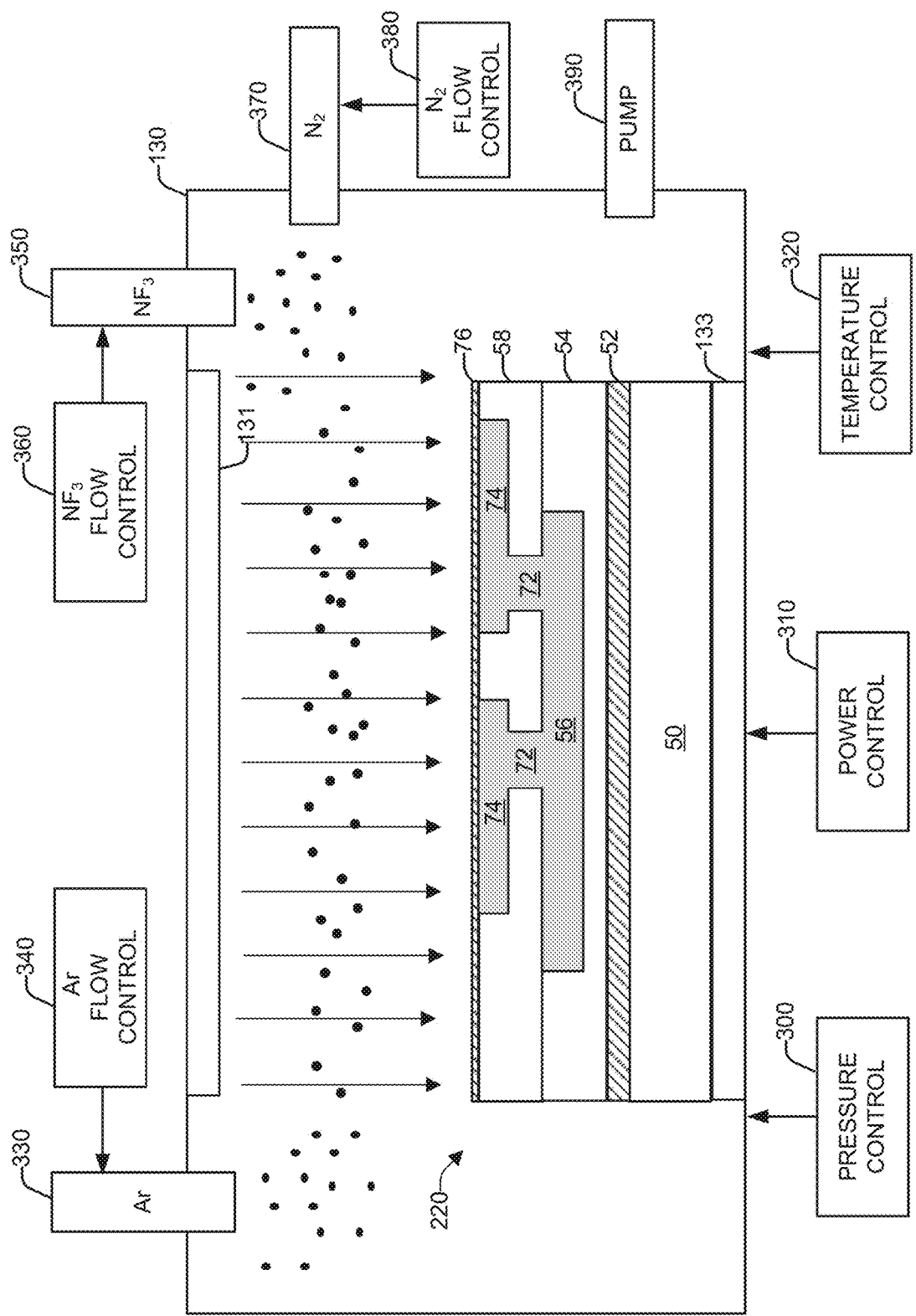
FIG. 7 illustrates a schematic cross-sectional view of the structure of FIG. 6 disposed in a dielectric deposition chamber undergoing a preclean process.
Figure 8:
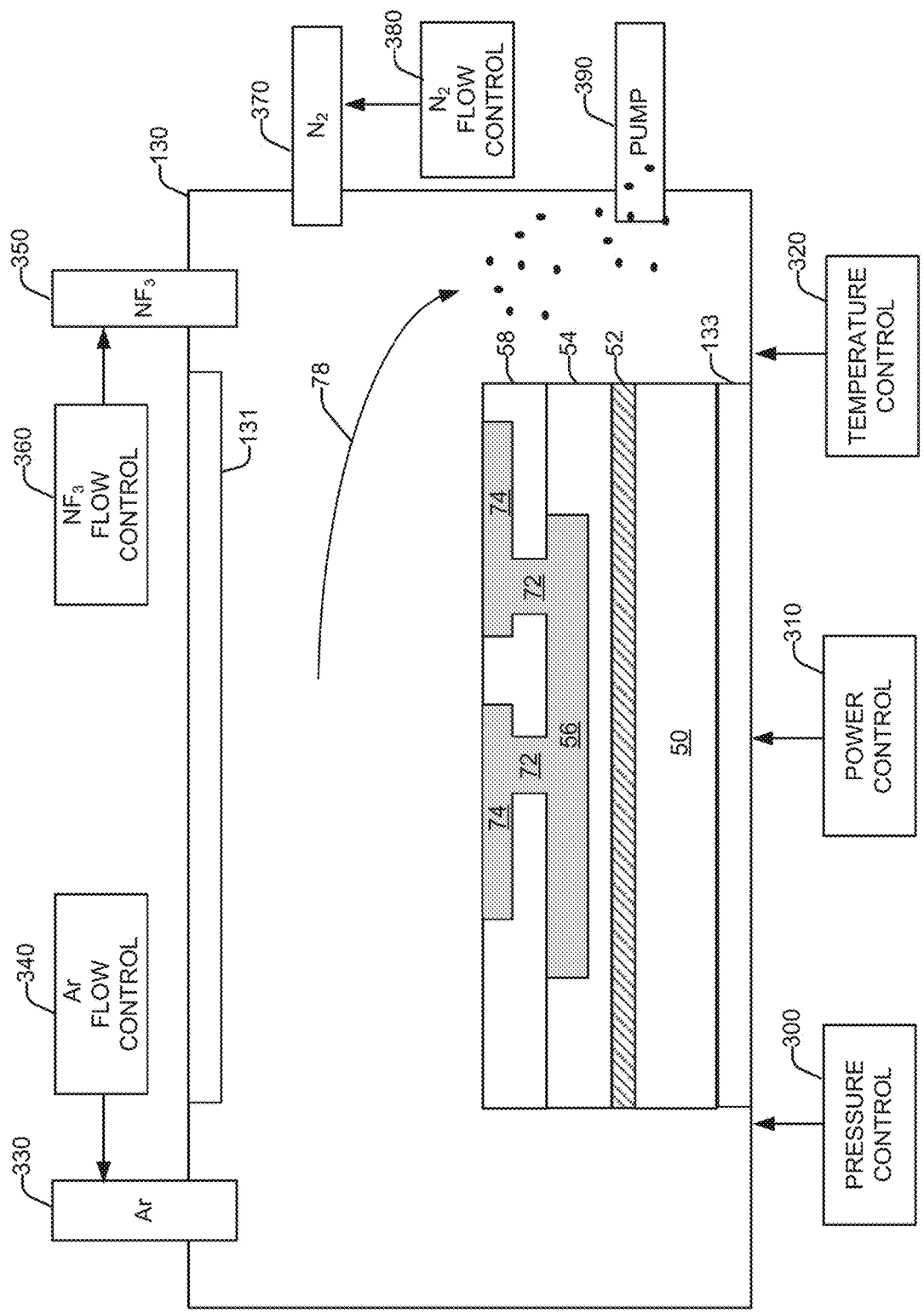
FIG. 8 illustrates a schematic cross-sectional view of the structure of FIG. 7 disposed in a dielectric deposition chamber undergoing an evacuation process.
Figure 9:
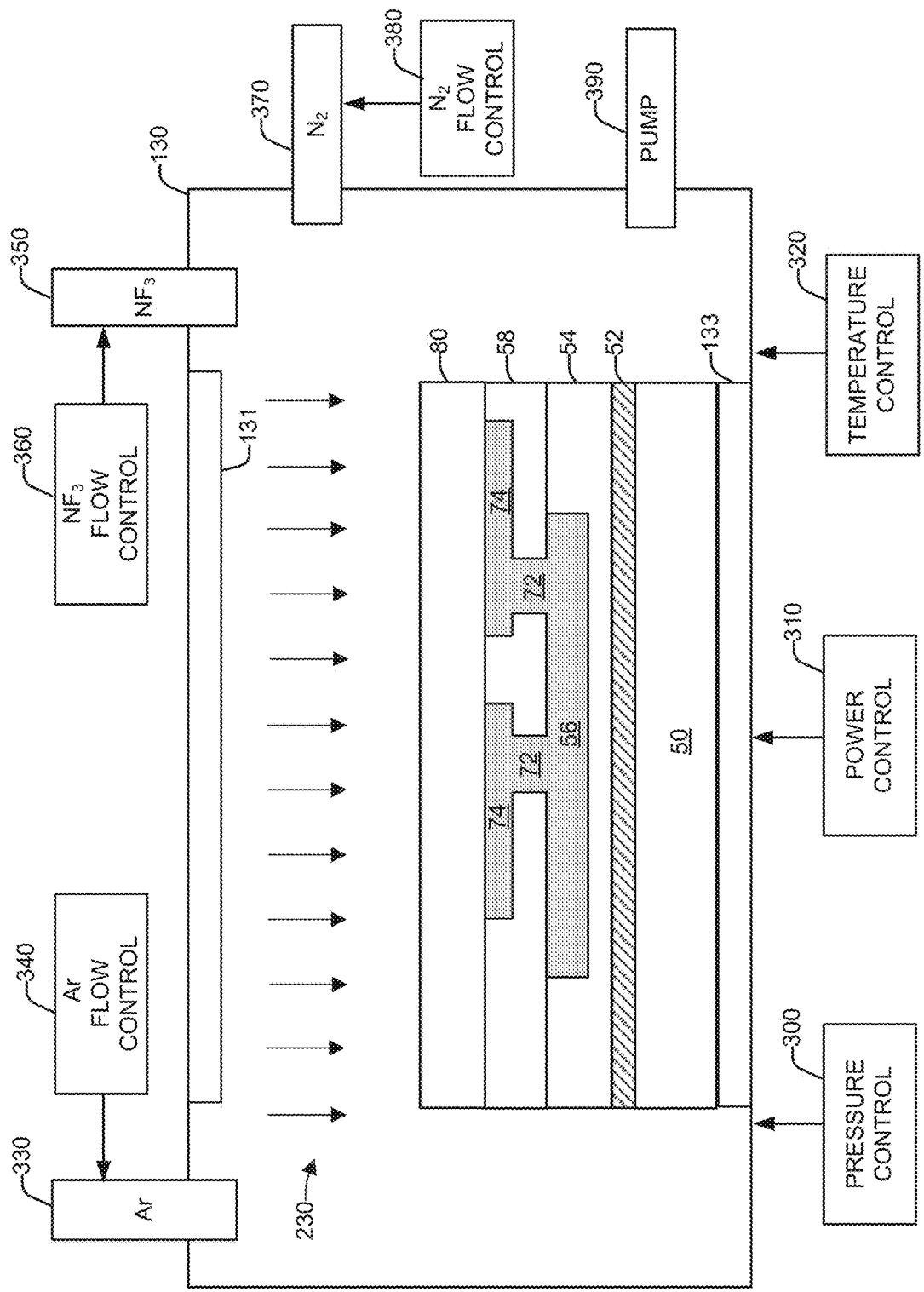
FIG. 9 illustrates a schematic cross-sectional view of the structure of FIG. 8 disposed in a dielectric deposition chamber undergoing a dielectric deposition process.

The resultant structure is then placed into a dielectric deposition chamber 130 to undergo a precleaning process followed by a vacuum process and a dielectric deposition process, as illustrated in FIGS. 7-9. The resultant structure could have an oxidized surface layer on the superconducting material due to its exposure to oxygen when being removed from the CMP chamber to the dielectric deposition chamber, or an oxidized layer in addition to the oxide layers formed from the CMP process. The purpose of the precleaning process is to remove these oxide layers from the metal interconnect surfaces and the top surface of the dielectric layer prior to their encapsulation in the next level dielectric layer.

As illustrated in FIG. 7, the dielectric deposition chamber 130 includes an Argon source 330 that provides Argon (Ar) gas into the dielectric deposition chamber 130 at a flow rate based on an Argon flow control device 340, and a nitrogen trifluoride ($NF_3$) gas source 350 that provides $NF_3$ gas into the dielectric deposition chamber 130 at a flow rate based on a $NF_3$ flow control device 360. The dielectric deposition chamber 130 also includes a pressure controller 300 that sets the pressure inside the chamber 130, a RF power controller 310 that sets the power in the dielectric deposition chamber 130 and a temperature controller 320 that sets the temperature in the dielectric deposition chamber 130. In one example, the dielectric deposition chamber 130 is an Applied Materials DxZ plasma enhanced chemical vapor deposition (PECVD) chamber attached to a Centura mainframe. However, this process could be used in a number of different PECVD chambers that are properly configured with $NF_3$ gas and plasma capabilities.

In this example, the $NF_3$ plasma is a parallel plate and not a remote plasma. Plasma is directed from a top plate 131 to a bottom plate 133, which could be a chuck, that holds the wafer. Typically, remote plasma $NF_3$ etches/cleans are used as chamber wall cleans and are not used as a process etch gas with a wafer present in the deposition chamber. However, it is possible to use remote $NF_3$ plasmas for the preclean process as well.

In one example, the wafer moves through a transfer chamber to the dielectric deposition chamber 130. Once the wafer is in the dielectric deposition chamber 130, the gas flows and pressures are stabilized, then a plasma is ignited to perform the preclean process 220 that etches the oxides 76 that have formed on the surfaces of the ILD and the superconducting interconnect metal. A typical process condition utilizes an $NF_3$ and Argon (Ar) gas mixture. Additionally, $N_2$ can be added to the gas mixture. In one example, $NF_3$ oxide preclean etch process conditions are as follows: $NF_3$ flow is set to about 25 sccm to about 45 sccm, Ar flow is set to about 1050 sccm to about 1250 sccm, $N_2$ flow (if applicable) is set to about 0 to about 200 sccm, power is set to about 700 W, process pressure is set to about 1.5 Torr, and the process time is set to greater than 10 seconds. A representative etch rate is about 300 Å/min to about 850 Å/min with a typical process temperature set to about 400° C.

Once the $NF_3$ preclean process is complete, the process gases are then pumped in a direction along arrow 78 by a pump 390, as shown in FIG. 8, to exhaust the gases to prepare the chamber 130 for the dielectric deposition process. In one example, all process gases are evacuated prior to the dielectric deposition process. In another example, only the $NF_3$ and Ar gases are evacuated while the $N_2$ gas continues to flow during the pumping process. A detail of note is that the wafer that was etched in the preclean process remains in the deposition chamber throughout the vacuum process and the subsequent dielectric deposition process. Typically, the vacuum process can take about 5 seconds to complete.

Next, as illustrated in FIG. 9, the wafer surface oxide 76 that was etched in the preclean process is encapsulated in a PECVD deposited dielectric layer 80 by undergoing a dielectric deposition process 230. This PECVD dielectric layer 80 could be silicon nitride, amorphous silicon, amorphous SiC, or any other non-oxide based PECVD deposited dielectric relevant to superconducting devices based on a damascene architecture.

In previous techniques, the millitorr level vacuum in the transfer chamber of the wafer between a preclean process and a dielectric deposition process is sufficient to regrow a surface oxide on both the interconnect metal (i.e. Nb) and the ILD (i.e. silicon nitride). Typically, this oxide is approximately a monolayer thick and can only be detected by a technique like secondary ion mass spectrometry (SIMS) where detection limits are below 0.1% for oxygen. Techniques like x-ray photoelectron spectroscopy and energy dispersive x-ray spectroscopy are not sensitive enough to detect oxygen that is formed on the dielectric and metal surfaces during this in vacuo transport step.

Figure 10:
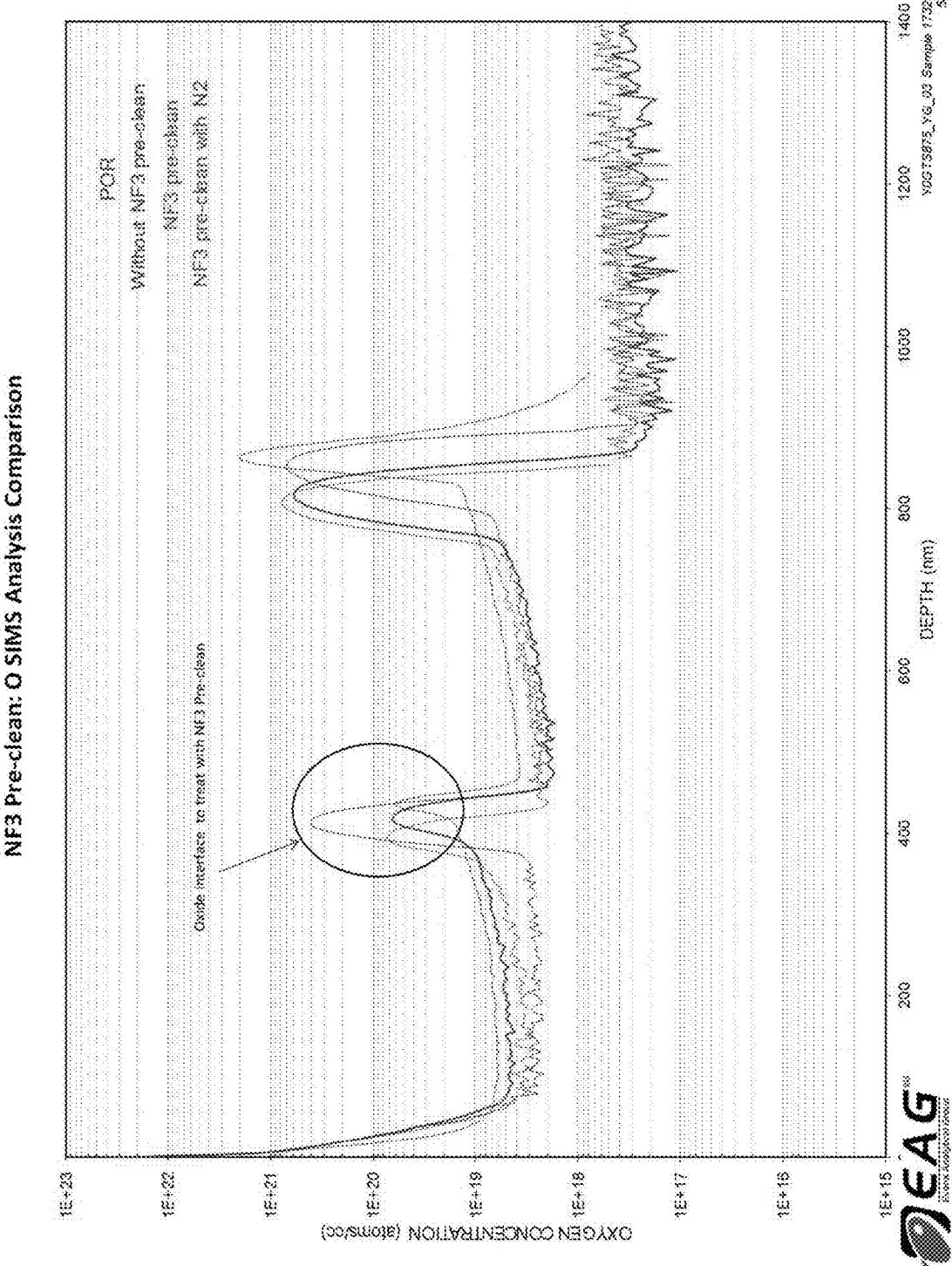
FIG. 10 illustrates a Secondary Ion Mass Spectrometer (SIMS) data graph of oxide Depth versus Oxygen Concentration (atoms/CC).

FIG. 10 illustrates a Secondary Ion Mass Spectrometer (SIMS) data graph of oxide Depth versus Oxygen Concentration (atoms/CC). The SIMS data graph shows that the $NF_3$ pre-clean effectively removes the dielectric surface oxide to a comparable level as the current state of the art process or record (POR) of utilizing two chambers and is effective when compared to doing no oxide etch.

What have been described above are examples of the invention. It is, of course, not possible to describe every conceivable combination of components or methodologies for purposes of describing the invention, but one of ordinary skill in the art will recognize that many further combinations and permutations of the invention are possible. Accordingly, the invention is intended to embrace all such alterations, modifications, and variations that fall within the scope of this application, including the appended claims.

What is claimed is:

1. A method of forming a superconductor device interconnect structure, the method comprising:
    forming a first dielectric layer overlying a substrate;
    forming a superconducting interconnect element in the first dielectric layer, the superconducting interconnect element having a top surface aligned with a top surface of the first dielectric layer to form a first interconnect layer;
    moving the superconductor device interconnect structure into a dielectric deposition chamber;
    performing a nitrogen trifluoride ($NF_3$) based plasma clean etch process on a top surface of the first interconnect layer by providing an $NF_3$ plasma, argon (Ar) gas, and nitrogen ($N_2$) gas in the dielectric deposition chamber to remove oxidization from the top surface of the first interconnect layer;
    pumping the $NF_3$ plasma and the argon (Ar) gas from the dielectric deposition chamber while maintaining flow of the $N_2$ gas; and
    depositing a second dielectric layer over the first interconnect layer in the dielectric deposition chamber.

2. The method of claim 1, wherein the superconducting interconnect element is formed from niobium.

3. The method of claim 1, wherein the first and second dielectric layers are formed from a non-oxide based dielectric material.

4. The method of claim 3, wherein the non-oxide based dielectric material is one of silicon nitride, amorphous silicon, and amorphous silicon carbide (SiC).

5. The method of claim 1, wherein the forming the superconducting interconnect element that has the top surface aligned with the top surface of the first dielectric layer to form the first interconnect layer comprises forming openings in the first dielectric layer, performing a contact material fill to fill the formed openings, and performing a chemical mechanical polish (CMP) to align the top surface of the superconducting interconnect element with the top surface of the first dielectric layer, wherein the cleaning process removes oxidization on a top surface of the superconducting interconnect element caused by the CMP.

6. The method of claim 1, wherein the superconducting interconnect element is a first conductive line and further comprising forming a second conductive line and a first contact in the second dielectric layer and a third conductive line and a second contact in the second dielectric layer, the first and second contacts being coupled to different portions of the first conductive line.

7. The method of claim 1, wherein the cleaning process comprises:
    setting a dielectric deposition chamber pressure to about 1.5T (Torr), and concurrently introducing nitrogen trifluoride ($NF_3$) gas at a flow rate of about 25 standard cubic centimeters per minute (sccm) to about 45 sccm, and the argon (Ar) gas at a flow rate of about 1050 sccm to about 1250 sccm;
    setting a temperature of the dielectric deposition chamber to about 400° C.;
    turning radio frequency (RF) power in the dielectric deposition chamber to about 700 Watts (W);
    etching the top surface of the first interconnect layer at an etch rate of about 300 to about 850 angstroms per minute for about 10 seconds; and
    evacuating the $NF_3$ gas and the Ar gas from the dielectric deposition chamber prior to the depositing a second dielectric layer over the first interconnect layer.

8. The method of claim 7, further comprising introducing the nitrogen ($N_2$) gas at about 0 sccm to about 200 sccm with the $NF_3$ gas and the Ar gas.

9. The method of claim 7, wherein the dielectric deposition chamber is a parallel plate plasma enhanced chemical vapor deposition (PECVD) chamber.

10. A method of forming a superconductor device interconnect structure, the method comprising:
    disposing a superconducting interconnect layer in a dielectric deposition chamber, the superconducting interconnect layer having a superconducting contact or conductive line having a top surface aligned with a top surface of a first dielectric layer, wherein a top surface of the superconducting contact or conductive line has an oxidized layer, and a top surface of the first dielectric layer has an oxidized layer;
    introducing nitrogen trifluoride ($NF_3$) gas into the dielectric deposition chamber;
    introducing argon (Ar) gas and nitrogen ($N_2$) gas into the dielectric deposition chamber;
    setting etch conditions to induce a plasma clean etch with the $NF_3$ gas and the Ar gas for a predetermined time period to remove the oxidized layer from the superconducting contact or conductive line and the oxidized layer from the first dielectric layer;
    evacuating the $NF_3$ gas and the Ar gas from dielectric deposition chamber while maintaining flow of the $N_2$ gas prior to depositing the second dielectric layer over the first interconnect layer; and
    depositing a second dielectric over the superconducting interconnect layer.

11. The method of claim 10, wherein the superconducting material employed to form the superconducting contact or conductive line is niobium (Nb), the oxidized layer being niobium oxide and the plasma clean etch removes the oxidized layer from a surface of the niobium to form a clean niobium top surface, and removes the oxidized layer from the first dielectric layer.

12. The method of claim 10, wherein the setting etch conditions comprises:
   setting a dielectric deposition chamber pressure to about 1.5T (Torr), while concurrently introducing the $NF_3$ gas at a flow rate of about 25 standard cubic centimeters per minute (sccm) to about 45 sccm, along with the argon (Ar) gas at a flow rate of about 1050 sccm to about 1250 sccm;
   setting a temperature of the dielectric deposition chamber to about 400° C.; and
   turning radio frequency (RF) power in the dielectric deposition chamber to about 700 Watts (W); and
   etching a surface of the superconducting interconnect layer at an etch rate of about 300 to about 850 angstroms per minute for about 10 seconds.

13. The method of claim 12, further comprising introducing the nitrogen ($N_2$) gas at about 0 sccm to about 200 sccm with the $NF_3$ gas and the Ar gas.

14. The method of claim 10, wherein the first and second dielectric layers are formed from a non-oxide based dielectric material.

15. The method of claim 14, wherein the non-oxide based dielectric material is one of silicon nitride, amorphous silicon, and amorphous silicon carbide (SiC).

16. The method of claim 10, wherein the superconducting interconnect layer is formed by forming openings in the first dielectric layer, performing a superconducting material fill to fill the formed openings, and performing a chemical mechanical polish (CMP) to align a top surface of the superconducting material fill with the top surface of the first dielectric layer, wherein the plasma clean etch process removes oxidization on the top surface of the superconducting material fill caused by the CMP.

17. The method of claim 10, wherein the superconducting interconnect element is a first conductive line and further comprising forming a second conductive line and a first contact in the second dielectric layer and a third conductive line and a second contact in the second dielectric layer, the first and second contacts being coupled to different portions of the first conductive line.

18. The method of claim 10, wherein the dielectric deposition chamber is a parallel plate plasma enhanced chemical vapor deposition (PECVD) chamber.

* * * * *